United States Patent
Huang et al.

(10) Patent No.: US 9,407,218 B2
(45) Date of Patent: Aug. 2, 2016

(54) MULTI-STAGE TRANSIMPEDANCE AMPLIFIER AND A METHOD OF USING THE SAME

(71) Applicant: TAIWAN SEMICONDUCTOR MANUFACTURING COMPANY, LTD., Hsinchu (TW)

(72) Inventors: Tsung-Ching Huang, San Jose, CA (US); Chan-Hong Chern, Palo Alto, CA (US); Ming-Chieh Huang, San Jose, CA (US); Chih-Chang Lin, San Jose, CA (US)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 19 days.

(21) Appl. No.: 14/088,610

(22) Filed: Nov. 25, 2013

(65) Prior Publication Data
US 2015/0145597 A1    May 28, 2015

(51) Int. Cl.
*H03F 3/08* (2006.01)
*H03F 3/45* (2006.01)
*H03F 1/08* (2006.01)

(52) U.S. Cl.
CPC ............ *H03F 3/45071* (2013.01); *H03F 1/086* (2013.01); *H03F 3/087* (2013.01); *H03F 3/45179* (2013.01); *H03F 3/08* (2013.01); *H03F3/085* (2013.01); *H03F 2200/372* (2013.01); *H03F 2203/45306* (2013.01); *H03F 2203/45528* (2013.01)

(58) Field of Classification Search
CPC .................. H03F 2200/294; H03F 2200/372; H03F 3/087; H03F 3/45098; H03F 1/34; H03F 3/45475; H03F 1/083; H03F 1/22; H03F 1/3211; H03F 2200/156; H03F 2200/453; H03F 2203/45318; H03F 2203/45392; H03F 2200/451; H03F 3/211; H03F 1/0205; H03F 1/086; H03F 1/565; H03F 2203/21106; H03F 2203/45528; H03F 3/19; H03F 3/195; H03F 1/08; H03F 2200/78
USPC ................... 330/59, 308; 250/214 A, 214 AG
See application file for complete search history.

(56) References Cited

U.S. PATENT DOCUMENTS 6,069,534 A * 5/2000 Kobayashi ................... 330/308
6,504,429 B2 * 1/2003 Kobayashi ..................... 330/85
(Continued)

OTHER PUBLICATIONS

Huapu Pan, et al. "High-speed receiver based on waveguide germanium photodetector wire-bonded to 90nm SOI CMOS amplifier", Optics Express, Jul. 23, 2012, vol. 20, No. 16.
(Continued)

*Primary Examiner* — Khanh V Nguyen
(74) *Attorney, Agent, or Firm* — Hauptman Ham, LLP

(57) ABSTRACT

A multi-stage transimpedance amplifier (TIA) which includes a common gate amplifier configured to receive a current signal, the common gate amplifier is configured to convert the current signal into an amplified voltage signal. The multi-stage TIA further includes a capacitive degeneration amplifier configured to receive the amplified voltage signal, the capacitive degeneration amplifier is configured to equalize the amplified voltage signal to form an equalized signal. The multi-stage TIA further includes an inverter configured to receive the equalized signal, the inverter is configured to increase a signal strength of the equalized signal to form an output signal. The multi-stage TIA further includes a feedback configured to receive the output signal, wherein the feedback is connected to an input and an output of the inverter.

20 Claims, 5 Drawing Sheets

(56) References Cited

U.S. PATENT DOCUMENTS 8,692,179 B2 * 4/2014 Cho et al. .................. 250/214 A
8,891,704 B2 * 11/2014 McLeod et al. ............... 375/348

OTHER PUBLICATIONS

Jonathan Proesel, et al. "25Gb/s 3.6pJ/b and 15Gb/s 1.37pJ/b VCSEL-Based Optical Links in 90nm CMOS", ISSCC 2012 / Session 24 / 10GBASE-T & Optical FRONTENDS / 24.5, Feb. 22, 2012, IEEE International Solid-State Circuits Conference.

Jonathan Proesel, et al. "25Gb/s 3.6pJ/b and 15Gb/s 1.37pJ/b VCSEL-Based Optical Links in 90nm CMOS", 2012, IEEE International Solid-State Circuits Conference.

Ian A. Young, et al. "Optical I/O Technology for Tera-Scale Computing", IEEE Journal of Solid-State Circuits, Jan. 2010, vol. 45, No. 1.

* cited by examiner

MULTI-STAGE TRANSIMPEDANCE AMPLIFIER AND A METHOD OF USING THE SAME

BACKGROUND

An optical link is more energy-efficient than an electrical link for high-speed (e.g., 40 Gbps or higher) input/output traffic, in some applications. A transimpedance amplifier (TIA) receives a small current signal from a photo detector in an optical receiver and converts the current signal into a voltage signal for a next circuit in the optical receiver. A low-power and high-sensitivity TIA is desirable for high-speed optical links. For TIA, reduction of jitter and input referred noise for the generation of a clean eye pattern in the received signal are issues for applications in high-data rates.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are examples and are not intended to be limiting.

Figure 1:
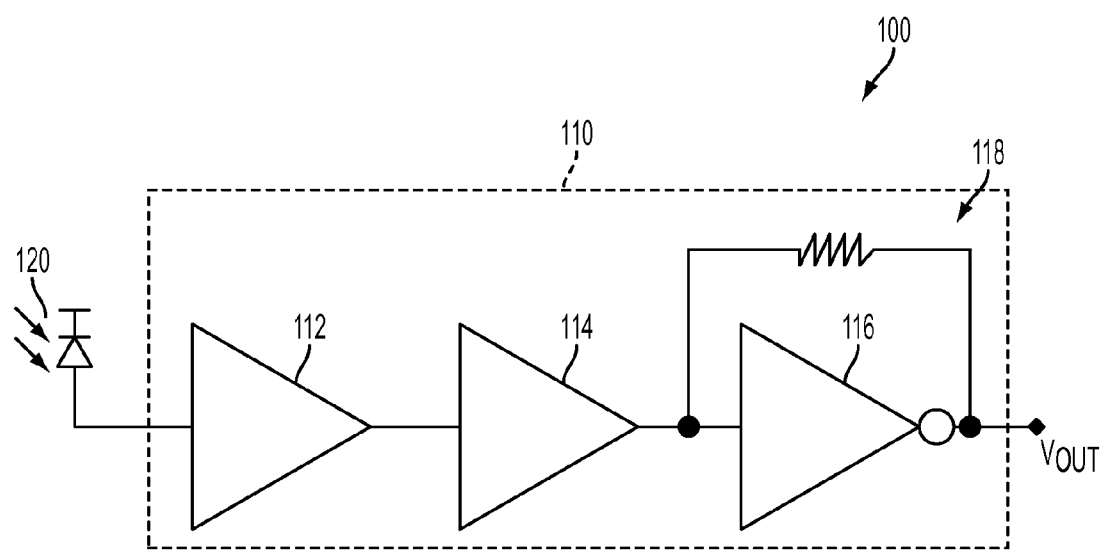
FIG. 1 is a block diagram of a multi-stage transimpedance amplifier (TIA) in accordance with one or more embodiments.

FIG. 1 is a block diagram of a multi-stage transimpedance amplifier (TIA) 110 in accordance with one or more embodiments. Multi-stage TIA 110 is connected to a photo-detector 120 and configured to receive a current signal from the photo-detector and convert the current signal into a voltage signal. Multi-stage TIA 110 includes a common gate amplifier 112 configured to receive the current signal from photo-detector 120 and to increase the bandwidth of the current signal and reduce noise in the current signal and output an amplified signal. Multi-stage TIA 110 further includes a capacitive degeneration amplifier 114 configured to receive the amplified signal. Capacitive degeneration amplifier 114 is configured to equalize the amplified signal by attenuating low frequencies of at a higher rate than high frequencies and to output an equalized signal. Multi-stage TIA 110 further includes an inverter 116 configured to increase a strength of the equalized signal and output an output signal for use by other circuitry. Multi-stage TIA 110 further includes a feedback 118 configured to connect the output signal to the equalized signal at an input of inverter 116.

In some embodiments, multi-stage TIA 110 is part of an optical receiver. In some embodiments, multi-stage TIA 110 is free of inductors. By not including inductors in multi TIA 110, an overall size of the multi-stage TIA is reduced in comparison with a TIA which includes inductors.

Common gate amplifier 112 is used in a complementary metal-oxide-semiconductor (CMOS) manufacturing process. In some embodiments, common gate amplifier 112 is configured to include bipolar junction transistors (BJTs) and is called a common base amplifier. Common gate amplifier 112 is configured to receive the current signal from photo-detector 120 and to convert the current signal to a voltage signal with an increased bandwidth and a reduced amount of noise in comparison with respect to the receive current signal. Common gate amplifier 112 is configured to output the amplified signal.

Capacitive degeneration amplifier 114 is configured to receive the amplified signal from common gate amplifier 112. Capacitive degeneration amplifier 114 is configured to equalize the amplified signal so that the equalized signal is substantially flat with respect to frequency. Capacitive degeneration amplifier 114 is configured to equalize the amplified signal by attenuating lower frequencies at a higher rate than higher frequency signals. In some embodiments, capacitive degeneration amplifier 114 includes a common source (CS) arrangement.

Inverter 116 is configured to increase the signal strength of the equalized signal to make the output signal more usable by other circuitry. Inverter 116 is includes a p-type metal-oxide-semiconductor (PMOS) transistor and an n-type metal-oxide-semiconductor (NMOS) transistor having drains connected to one another. Inverter 116 further includes feedback 118 connected to the output signal and to the equalized signal.

Figure 1B:
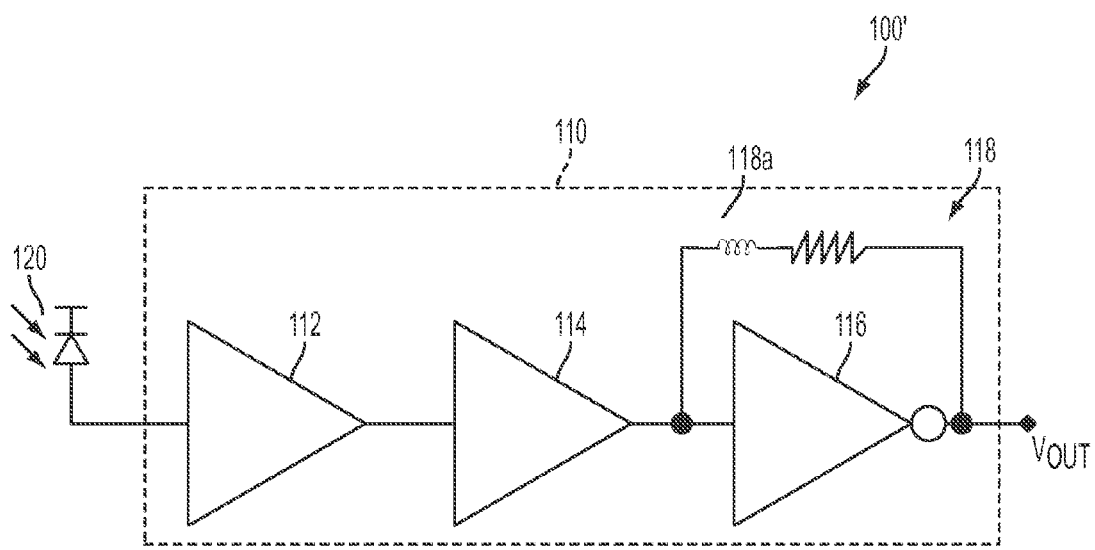
FIG. 1B is a block diagram of a multi-stage TIA including an inductor in accordance with some embodiments.

Feedback 118 is configured to provide a feedback signal to inverter 116. In some embodiments, feedback 118 includes a resistor. In some embodiments, feedback 118 includes an inductor. In some embodiments, feedback 118 includes both a resistor and an inductor connected in series. FIG. 1B is a block diagram of a multi-stage TIA 100' including an inductor 118a in accordance with some embodiments.

Figure 2:
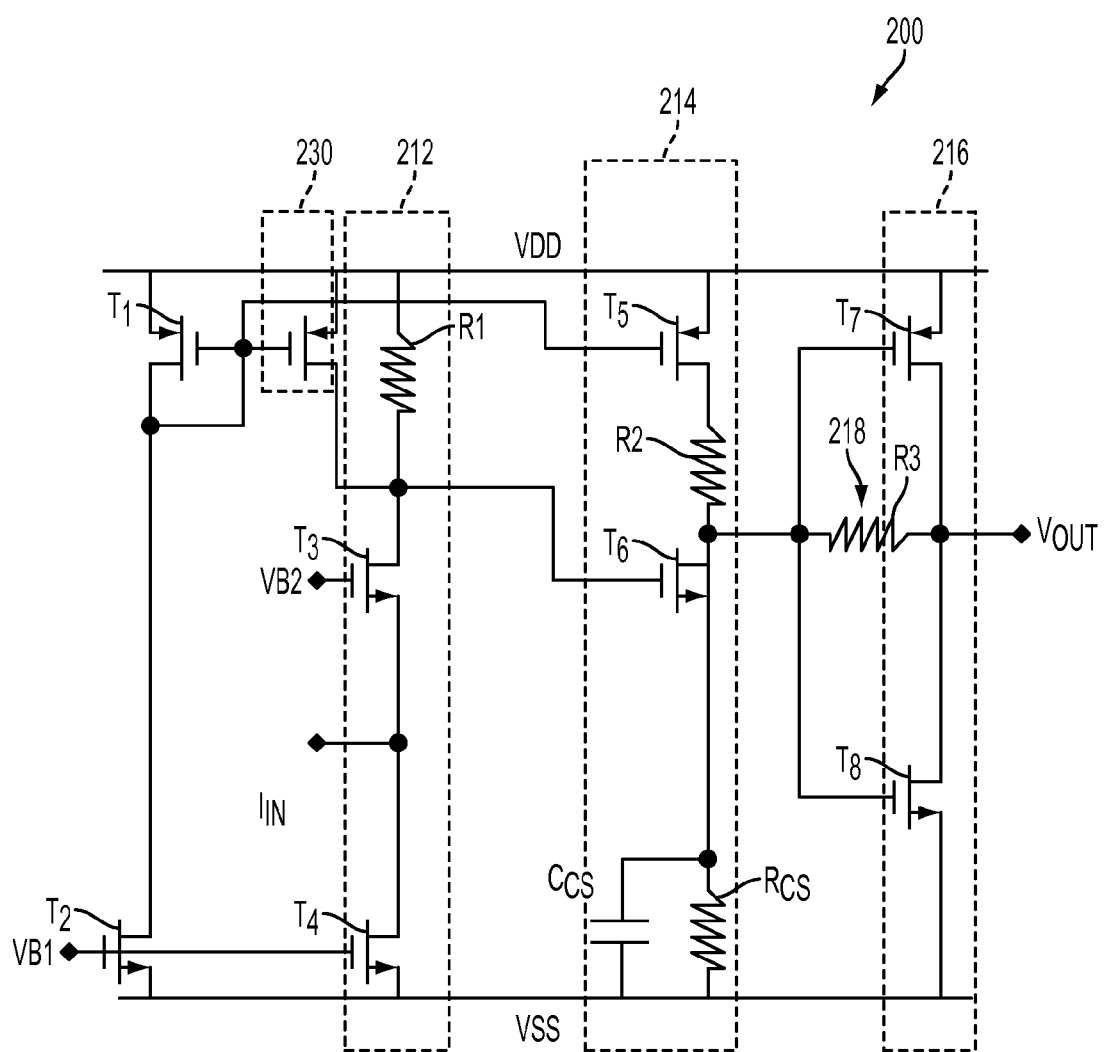
FIG. 2 is a schematic diagram of a single-ended multi-stage TIA in accordance with one or more embodiments.

FIG. 2 is a schematic diagram of a single-ended multi-stage TIA 200 in accordance with one or more embodiments. Single-ended multi-stage TIA 200 includes a common gate amplifier 212 configured to receive a current signal $I_{IN}$ from a photo-detector, the common gate amplifier 212 is configured to output an amplified signal. Single-ended multi-stage TIA 200 further includes a capacitive degeneration amplifier 214 configured to receive the amplified signal from common gate amplifier 212. In some embodiments, capacitive degeneration amplifier 214 includes a common source 215 to aid in equalizing the amplified signal. Capacitive degeneration amplifier 214 is configured to output an equalized signal. Single-ended multi-stage TIA 200 includes an inverter 216 configured to receive the equalized signal. Inverter 216 is configured to output an output signal. Single-ended multi-stage TIA 200 includes a feedback 218 configured to connect the output signal to an input of inverter 216. Single-ended multi-stage TIA 200 further includes a first transistor T1 connected to a supply voltage VDD and a second transistor T2 connected to a reference voltage VSS. In some embodiments, supply voltage VDD ranges from about 0.8 volts (V) to about 1.2 V. In some embodiments, reference voltage VSS is a ground voltage. In some embodiments, single-ended multi-stage TIA 200 further includes a gain boost transistor 230 configured to increase a direct current (DC) voltage of the amplified signal output by common gate amplifier 212.

Common gate amplifier 212 includes a third transistor T3 connected to reference voltage VSS and a fourth transistor T4 connected to supply voltage VDD. A first resistor R1 is connected between fourth transistor T4 and supply voltage VDD. A gate of third transistor T3 is configured to receive a first bias voltage VB1. A gate of fourth transistor T4 is configured to receive a second bias voltage VB2. By adjusting first bias voltage VB1 and second bias voltage VB2, an effective resistance of third transistor T3 and forth transistor T4, respectively, is adjustable.

Common gate amplifier 212 is configured to receive current signal $I_{IN}$ at a node located between third transistor T3 and fourth transistor T4. In some embodiments, third transistor T3 is an NMOS transistor and a source of the third transistor is connected to reference voltage VSS. In some embodiments, fourth transistor T4 is a PMOS transistor and a source of the fourth transistor is connected to a first side of first resistor R1. A second side of first resistor R1 is connected to supply voltage VDD. The amplified signal is output at a first node N1 located between fourth transistor T4 and first resistor R1.

In operation, common gate amplifier 212 receives current signal $I_{IN}$, first bias voltage VB1 and second bias voltage VB2. First bias voltage VB1 and second bias voltage VB2 determine the input resistance for the current signal $I_{IN}$. Current signal $I_{IN}$ also impacts the current flowing within common gate amplifier 212 from supply voltage VDD to reference voltage VSS to determine a voltage level at first node N1.

Capacitive degeneration amplifier 214 includes a fifth transistor T5 connected to supply voltage VDD and a sixth resistor connected to reference voltage VSS. A second resistor R2 is positioned between fifth transistor T5 and sixth transistor T6. An output of capacitive degeneration amplifier 214 is located at a second node N2 between second resistor R2 and sixth transistor T6.

A gate of fifth transistor is connected to a gate of first transistor T1 and a terminal of first transistor T1. A gate of sixth transistor T6 is connected to first node N1. In some embodiments, fifth transistor T5 is a PMOS transistor having a source connected to supply voltage and a drain connected to a first side of second resistor R2. In some embodiments, sixth transistor T6 is an NMOS transistor having a source connected to supply voltage VSS and a drain connected to a second side of second resistor R2.

In some embodiments, common source 215 is connected between sixth transistor T6 and reference voltage VSS. Common source 215 includes a common source capacitor $C_{CS}$ connected in parallel with a common source resistor $R_{CS}$. Common source 215 provides an equalization function for low input frequencies to help equalize the signal with respect to higher and lower frequencies.

In operation, first transistor T1 and second transistor T2 are used to provide a biasing signal to the gate of fifth transistor T5 to determine a resistance of the fifth transistor. The voltage at first node N1 determines a resistance of sixth transistor T6. The combined resistance of fifth transistor T5, sixth transistor T6 and second resistor R2 determines a voltage at second node N2. In some embodiments which include common source 215, the common source helps to even out a voltage level at second node N2 for low frequency current signals $I_{IN}$.

Inverter 216 is configured to increase signal strength and voltage swing of an output signal $V_{OUT}$ for use by additional circuitry. Inverter 216 includes a seventh transistor T7 connected to supply voltage VDD. Inverter 216 further includes an eighth transistor T8 connect to reference voltage VSS. A gate of seventh transistor T7 and a gate of eighth transistor T8 are connected to second node N2. An output of inverter 216 is positioned between seventh transistor T7 and eighth transistor T8 at a third node N3. Output signal $V_{OUT}$ is output from third node N3. In some embodiments, seventh transistor T7 is a PMOS transistor having a source connected to supply voltage VDD and a drain connected to third node N3. In some embodiments, eighth transistor T8 is an NMOS transistor having a source connected to reference voltage VSS and a drain connected to third node N3.

In operation, a voltage level at second node N2 determines a resistance of seventh transistor T7 and eighth transistor T8. The resistance of seventh transistor T7 and eighth transistor T8 determines a voltage level at third node N3 which is output as output signal $V_{OUT}$.

Feedback 218 includes a third resistor R3 between second node N2 and third node N3. A first side of third resistor R3 is connected to second node N2, the gate of seventh transistor T7 and the gate of eighth transistor T8. A second end of third resistor R3 is connected to third node N3. In some embodiments, feedback 218 includes an inductor connected in series with third resistor R3. In some embodiments, feedback 218 includes an inductor in place of third resistor R3.

In operation, feedback 218 helps to determine the voltage level at second node N2, which in turn impacts the resistance of seventh transistor T7 and eighth transistor T8.

In some embodiments, single-ended multi-stage TIA 200 includes gain boost transistor 230 configured to provide a DC current for third transistor T3 to maintain sufficient transconductance gm while using higher resistance value for first resistor R1 to boost signal gain. A gate of gain boost transistor is connected to the gate of first transistor T1 and to the gate of fifth transistor T5. In some embodiments, gain boost transistor is a PMOS transistor having a source connected to supply voltage VDD and a drain connected to first node N1. Gain boost transistor 230 is connected in parallel with first resistor R1. The resistance of the parallel connected gain boost transistor 230 and first resistor R1 enables a higher voltage from supply voltage VDD to be transferred to first node N1 in comparison with the first resistor alone.

In some embodiments, single-ended multi-stage TIA 200 includes a low drop out (LDO) regulator configured to reduce signal noise. The LDO regulator helps to provide a more stable supply voltage VDD to single-ended multi-stage TIA 200 in comparison to a single-ended multi-stage TIA which does not include an LDO regulator. The more stable supply voltage VDD in turn reduces signal noise in output signal $V_{OUT}$.

Figure 3:
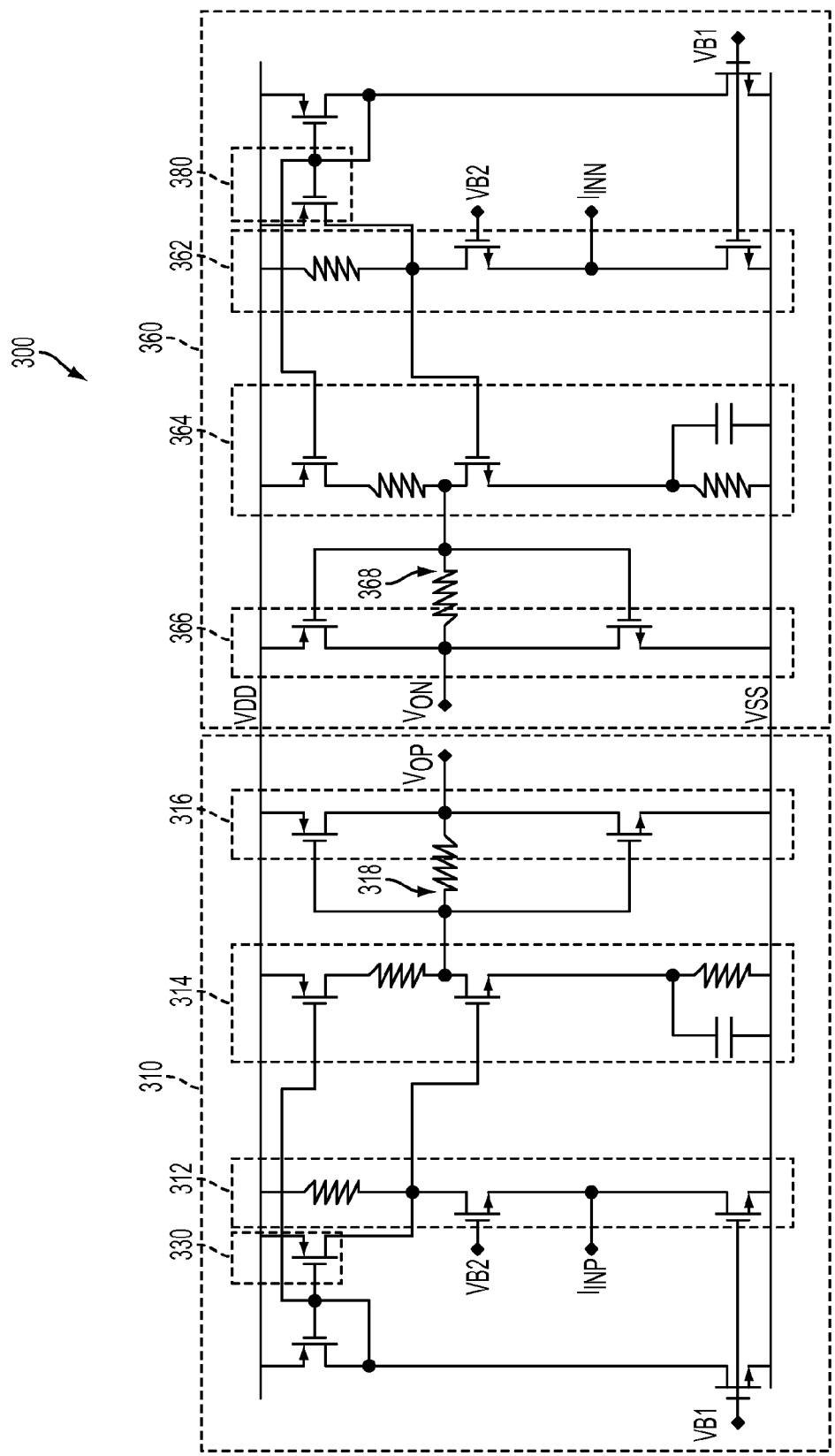
FIG. 3 is a schematic diagram of a differential multi-stage TIA in accordance with one or more embodiments.

FIG. 3 is a schematic diagram of a differential multi-stage TIA 300 in accordance with one or more embodiments. Differential multi-stage TIA 300 includes two single-ended multi-stage TIAs, e.g., single-ended multi-stage TIA 200. A first single-ended multi-stage TIA 310 is configured to receive a first differential current signal $I_{INP}$ from a photo-detector and to output a first differential output signal $V_{OP}$. A second single-ended multi-stage TIA 360 is configured to receive a second differential current signal $I_{INN}$ from a photo-detector and to output a second differential output signal $V_{ON}$. In some embodiments, each of first single-ended multi-stage TIA 310 and second single-ended multi-stage TIA 360 has a similar configuration as single-ended multi-stage TIA 200 described above. Similar elements have a same reference number increased by 100 for first single-ended multi-stage TIA 310 and increased by 150 for second single-ended multi-stage TIA 360.

In operation, differential multi-stage TIA 300 receives first differential current signal $I_{INP}$ and second differential current signal $I_{INN}$ from the photo-detector. Each of first single-ended multi-stage TIA 310 and second single-ended multi-stage TIA 360 process a respective differential current signal is a manner similar to single-ended multi-stage TIA 200. Differential multi-stage TIA 300 outputs first differential output signal $V_{OP}$ and second differential output signal $V_{ON}$. The differential output signals are compared with one another for use in additional circuitry for determining an overall output of differential multi-stage TIA 300. In some embodiments, the differential output signals are compared using a sense amplifier or other suitable circuitry.

Dimensions of differential multi-stage TIA 300 are increased with respect to single-ended multi-stage TIA 200 because the differential multi-stage TIA includes more components. However, in comparison with single-ended multi-stage TIA 200, differential multi-stage TIA 300 is capable of operating at a higher speed. In single-ended multi-stage TIA 200, determining a logically high or low signal is based on the output signal $V_{OUT}$ exceeding a threshold value. In some embodiments, a delay time is built into subsequent circuitry to provide output signal $V_{OUT}$ with sufficient time to exceed the threshold value prior to using the output signal for further processing. By comparing differences between first differential output signal $V_{OP}$ and second differential output signal $V_{ON}$, determining a logically high or low signal is determinable without waiting for either the first differential output signal or the second differential output signal to exceed a threshold value.

In addition differential multi-stage TIA 300 provides better noise reduction than single-ended multi-stage TIA 200. The noise reduction is also a result of the comparison between first differential output signal $V_{OP}$ and second differential output signal $V_{ON}$. Both of first differential output signal $V_{OP}$ and second differential output signal $V_{ON}$ are generated by similar circuits and will have a similar signal noise. The comparison of the differential output signals compensates for the signal noise. In contrast, single-ended multi-stage TIA 200 includes no such comparison. In some embodiments, single-ended multi-stage TIA 200 includes an LDO regulator configured to reduce signal noise.

The inclusion of a capacitive degeneration amplifier in the multi-stage TIA also helps to decrease jitter performance in the multi-stage TIA, in comparison with other types of TIA. In at least one example, the multi-stage TIA described above is able to provide an output signal having a clean eye pattern and a jitter of about 1 picosecond (ps) or less, in comparison with other types of TIA which have a jitter of about 10 ps.

In some embodiments, the multi-stage TIA has a power consumption ranging from about 2.4 milliWatts (mW) to about 24 mW, in comparison with other types of TIA which have a power consumption of about 75 mW. In some embodiments, the multi-stage TIA has a power consumption of about 2.4 mW to about 9.5 mW.

In some embodiments, the multi-stage TIA has a gain of about 300 ohms to about 1750 ohm, in comparison with other types of Tia which have a gain of about 195 ohm. In some embodiments, the multi-stage TIA has a gain ranging from about 1200 ohms to about 1750 ohms.

In some embodiments, the multi-state TIA has an input sensitivity ranging from about 10 microamps (µA) to about 40 µA, in comparison with other types of TIA which have an input sensitivity ranging from about 200 µA to about 400 µA.

In at least one example, the supply voltage VDD for the multi-stage TIA is 1.2 V, the power consumption is 9.5 mW, the gain is 1750 ohms, and the input sensitivity is 10 µA for a high speed input signal at 40 Gbps. The lower power consumption, higher gain and increased input sensitivity result in a better efficiency for the multi-stage TIA in comparison with other types of TIA.

The multi-stage TIA is also able to provide better DC offset cancellation than other types of TIA. As an intensity of light contacting the photo-detector increases, the magnitude of the current signal also increases. If the current becomes too strong, the current signal and distort the performance of a TIA. The configuration of the multi-stage TIA helps to provide an equalized signal which can compensate for the effects of a high magnitude current signal.

Figure 4:
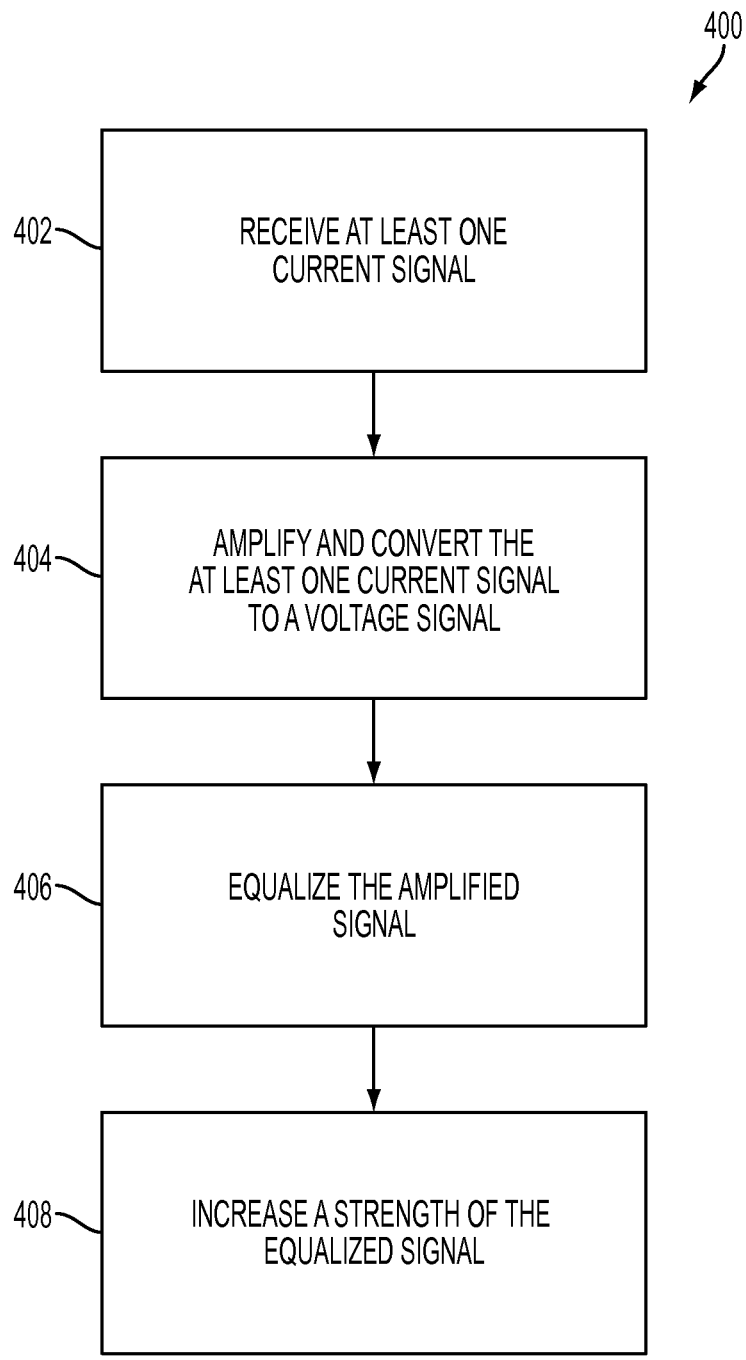
FIG. 4 is a flow chart of a method of using a multi-stage TIA in accordance with one or more embodiments.

FIG. 4 is a flow chart of a method 400 of using a multi-stage TIA in accordance with one or more embodiments. Method 400 begins with operation 402 in which the multi-stage TIA receives at least one current signal. In some embodiments, the at least one current signal is a single current signal, e.g., current signal $I_{IN}$ (FIG. 2). In some embodiments, the at least one current signal is a differential current signal, e.g. first differential current signal $I_{INP}$ and second differential current signal $I_{INN}$ (FIG. 3).

Method 400 continues with operation 404 in which the at least one current signal is converted to a voltage signal and amplified. In some embodiments, the at least one current signal is converted to the voltage signal and amplified using a common gate amplifier, e.g., common gate amplifier 212 (FIG. 2). In some embodiments, the at least one current signal is converted to the voltage signal and amplified using a common base amplifier.

In operation 406, the amplified signal is equalized. In some embodiments, the amplified signal is equalized using a capacitive degeneration amplifier, e.g., capacitive degeneration amplifier 214 (FIG. 2). In some embodiments, the capacitive degeneration amplifier includes a common source, e.g. common source 215 (FIG. 2).

In operation 408, a signal strength of the equalized signal is increased. In some embodiments, the signal strength of the equalized signal is increased using an inverter, e.g., inverter 216 (FIG. 2). In some embodiments, the inverter is connected to a resistive feedback, e.g., feedback 218. In some embodiments, the inverter is connected to an inductive feedback. In some embodiments, the inverter is connected to a feedback which includes a resistor and an inductor connected in series.

One of ordinary skill in the art would recognize additional operations are able to be added to method 400 and an order of operation of the method are able to be modified.

One aspect of this description relates to a multi-stage TIA. The multi-stage TIA includes a common gate amplifier configured to receive a current signal, the common gate amplifier is configured to convert the current signal into an amplified voltage signal. The multi-stage TIA further includes a capacitive degeneration amplifier configured to receive the amplified voltage signal; the capacitive degeneration amplifier is configured to equalize the amplified voltage signal to form an equalized signal. The multi-stage TIA further includes an inverter configured to receive the equalized signal; the inverter is configured to increase a signal strength of the equalized signal to form an output signal. The multi-stage TIA further includes a feedback configured to receive the output signal, wherein the feedback is connected to an input and an output of the inverter.

Another aspect of this description relates to a multi-stage TIA. The multi-stage TIA includes a first amplifier connected between a supply voltage and a reference voltage, the first amplifier is configured to receive a first input current signal and output a first amplified signal. The multi-stage TIA further includes a first capacitive degeneration amplifier connected between the supply voltage and the reference voltage, the first capacitive degeneration amplifier is configured to receive the first amplified signal and output a first equalized signal. The multi-stage TIA further includes a first inverter connected between the supply voltage and the reference voltage, the first inverter is configured to receive the first equalized signal and output a first output signal. The multi-stage TIA further includes a first feedback connected to an output of the first inverter and an input of the first inverter.

Still another aspect of this description relates to a method of using a multi-stage TIA. The method includes receiving at least one input current signal and amplifying the at least one input current signal using at least one amplifier to form an amplified signal. The method further includes equalizing the amplified signal using a capacitive degeneration amplifier to form an equalized signal, increasing a signal strength of the equalized signal using an inverter to form an output signal, and outputting the output signal.

After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A multi-stage transimpedance amplifier (TIA) comprising:
    a common gate amplifier configured to receive a current signal, wherein the common gate amplifier is configured to convert the current signal into an amplified voltage signal;
    a capacitive degeneration amplifier configured to receive the amplified voltage signal, wherein the capacitive degeneration amplifier is configured to equalize the amplified voltage signal to form an equalized signal;
    an inverter configured to receive the equalized signal, wherein the inverter is configured to increase a signal strength of the equalized signal to form an output signal, and the inverter is directly connected to the capacitive degeneration amplifier; and
    a feedback configured to receive the output signal, wherein the feedback is connected to an input and an output of the inverter.

2. The multi-stage TIA of claim 1, wherein the multi-stage TIA is free of inductors.

3. The multi-stage TIA of claim 1, further comprising a gain boost transistor connected to an output of the common gate amplifier.

4. The multi-stage TIA of claim 1, wherein the capacitive degeneration amplifier comprises a common source arrangement.

5. The multi-stage TIA of claim 1, wherein the feedback comprises at least one resistor.

6. The multi-stage TIA of claim 5, wherein the feedback comprises at least one inductor connected in series with the at least one resistor.

7. The multi-stage TIA of claim 1, wherein the feedback comprises at least one inductor connected in series with at least one resistor.

8. A multi-stage transimpedance amplifier (TIA) comprising:
    a first amplifier connected between a supply voltage and a reference voltage, the first amplifier is configured to receive a first input current signal and output a first amplified signal;
    a first capacitive degeneration amplifier connected between the supply voltage and the reference voltage, the first capacitive degeneration amplifier is configured to receive the first amplified signal and output a first equalized signal;
    a first inverter connected between the supply voltage and the reference voltage, the first inverter is configured to receive the first equalized signal and output a first output signal, and the inverter is directly connected to the first capacitive degeneration amplifier; and
    a first feedback connected to an output of the first inverter and an input of the first inverter.

9. The multi-stage TIA of claim 8, further comprising:
    a first transistor having a first terminal connected to the supply voltage, wherein a gate of the first transistor is connected to the first capacitive degeneration amplifier; and
    a second transistor having a first terminal connected to the reference voltage, wherein a gate of the second transistor is configured to receive a first bias voltage,
    wherein a second terminal of the first transistor is connected to a second terminal of the second transistor.

10. The multi-stage TIA of claim 9, wherein the first amplifier comprises:
    a first resistor connected to the supply voltage;
    a third transistor connected in series to the first resistor; and
    a fourth transistor connected in series to the third transistor,
    wherein the first amplifier is configured to receive the first input current signal at a node located between the third transistor and the fourth transistor, and to output the first amplified signal from a node located between the third transistor and the first resistor.

11. The multi-stage TIA of claim 10, wherein a gate of the third transistor is configured to receive a second bias voltage, and a gate of the fourth transistor is configured to receive the first bias voltage.

12. The multi-stage TIA of claim 9, wherein the capacitive degeneration amplifier comprises:
    a first resistor;
    a third transistor connected in series to the first resistor, wherein the third transistor is connected to the supply voltage; and
    a fourth transistor connected in series to the third transistor,
    wherein a gate of the third transistor is connected to the gate of the first transistor, a gate of the fourth transistor is configured to receive the first amplified signal, and the capacitive degeneration amplifier is configured to output the first equalized signal from a node located between the fourth transistor and the first resistor.

13. The multi-stage TIA of claim 12, wherein the capacitive degeneration amplifier further comprises a common source between the fourth transistor and the reference voltage, the common source comprising:
    a first capacitor; and
    a second resistor connected in parallel with the first capacitor.

14. The multi-stage TIA of claim 9, wherein the first inverter comprises:
    a third transistor; and
    a fourth transistor connected in series with the third transistor,
    wherein a gate of the third transistor and a gate of the fourth transistor are configured to receive the first equalized signal, and the inverter is configured to output the first output signal from a node located between the third transistor and the fourth transistor.

15. The multi-stage TIA of claim 9, further comprising a gain boost transistor connected to the supply voltage, wherein a gate of the gain boost transistor is connected to the gate of the first transistor, and a terminal of the gain boost transistor is connected to the first amplifier.

16. The multi-stage TIA of claim 8, wherein the first feedback comprises at least one of a feedback resistor or a feedback inductor.

17. The multi-stage TIA of claim 8, further comprising:
- a second amplifier connected between the supply voltage and the reference voltage, the second amplifier is configured to receive a second input current signal and output a second amplified signal;
- a second capacitive degeneration amplifier connected between the supply voltage and the reference voltage, the second capacitive degeneration amplifier is configured to receive the second amplified signal and output a second equalized signal;
- a second inverter connected between the supply voltage and the reference voltage, the second inverter is configured to receive the second equalized signal and output a second output signal; and
- a second feedback connected to an output of the second inverter and an input of the second inverter.

18. The multi-stage TIA of claim 17, wherein the first input current signal and the second input current signal are differential current input signals.

19. The multi-stage TIA of claim 17, wherein the first output signal and the second output signal are differential output signals.

20. A method of using a multi-stage transimpedance amplifier (TIA), the method comprising:
- receiving at least one input current signal;
- amplifying the at least one input current signal using at least one amplifier to form an amplified signal;
- equalizing the amplified signal using a capacitive degeneration amplifier to form an equalized signal;
- increasing a signal strength of the equalized signal using an inverter to form an output signal, the inverter being directly connected to the capacitive degeneration amplifier feeding back the output signal to an input node of the inverter; and
- outputting the output signal.

* * * * *